(12) United States Patent
Son et al.

(10) Patent No.: US 11,841,568 B2
(45) Date of Patent: Dec. 12, 2023

(54) DISPLAY PANEL AND TILED DISPLAY APPARATUS HAVING THE SAME

(71) Applicant: Samsung Display Co., Ltd., Yongin-Si (KR)

(72) Inventors: Younghye Son, Yongin-si (KR); Donghyeon Lee, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 16/712,069

(22) Filed: Dec. 12, 2019

(65) Prior Publication Data

US 2020/0211929 A1 Jul. 2, 2020

(30) Foreign Application Priority Data

Dec. 28, 2018 (KR) .................. 10-2018-0171730

(51) Int. Cl.
| | | |
|---|---|---|
| G02F 1/1333 | (2006.01) | |
| G06F 3/14 | (2006.01) | |
| G09F 9/302 | (2006.01) | |
| H10K 59/18 | (2023.01) | |
| G02B 17/00 | (2006.01) | |

(52) U.S. Cl.
CPC ........ *G02F 1/13336* (2013.01); *G06F 3/1446* (2013.01); *G09F 9/3026* (2013.01); *H10K 59/18* (2023.02); *G02B 17/006* (2013.01)

(58) Field of Classification Search
CPC ............ G06F 3/1446; G06F 2300/026; G06F 2300/0426; G09G 2360/04; G02F 1/13336; G09F 9/3026; Y10S 345/903; H01L 27/3293; H01L 27/3267; H10K 59/131; H10K 59/40; H10K 77/111; H10K 2102/311; H10K 59/18; H05K 1/028; H05K 2201/10128; H05K 2201/10363

See application file for complete search history.

(56) References Cited

U.S. PATENT DOCUMENTS

| | | | |
|---|---|---|---|
| 5,903,328 A | 5/1999 | Greene et al. | |
| 6,813,853 B1 * | 11/2004 | Tucker | G09F 9/33 340/815.45 |
| 6,885,157 B1 * | 4/2005 | Cok | H01L 27/323 345/173 |
| 9,081,552 B1 * | 7/2015 | Hall | G06F 1/189 |

(Continued)

FOREIGN PATENT DOCUMENTS

| | | |
|---|---|---|
| CN | 103217845 A | 7/2013 |
| CN | 104090405 A | 10/2014 |

(Continued)

*Primary Examiner* — Xuemei Zheng
(74) *Attorney, Agent, or Firm* — CANTOR COLBURN LLP

(57) ABSTRACT

A display panel includes a display area, in which a plurality of pixels is arranged and a plurality of peripheral areas surrounding the display area. The display panel includes a first substrate, a second substrate disposed opposite to the first substrate, a first external signal line disposed on the first substrate in a first peripheral area of plurality of peripheral areas and connected to an external device, and a first through-hole terminal including a conductive material filled in a hole defined through the first substrate in an area in which the first external signal line is disposed.

19 Claims, 13 Drawing Sheets

(56) References Cited

U.S. PATENT DOCUMENTS

| | | | | |
|---|---|---|---|---|
| 9,483,227 | B2* | 11/2016 | Patterson | G06F 3/0304 |
| 9,793,330 | B2 | 10/2017 | Li | |
| 10,672,853 | B2 | 6/2020 | Ha et al. | |
| 2002/0008809 | A1* | 1/2002 | Babuka | G09F 9/3026 |
| | | | | 349/73 |
| 2003/0101580 | A1* | 6/2003 | Arifuku | H05K 3/225 |
| | | | | 29/825 |
| 2004/0080032 | A1* | 4/2004 | Kimura | H01L 27/1288 |
| | | | | 257/678 |
| 2005/0017268 | A1* | 1/2005 | Tsukamoto | H01L 27/3293 |
| | | | | 257/200 |
| 2006/0100314 | A1* | 5/2006 | Arifuku | H01L 24/29 |
| | | | | 523/210 |
| 2006/0267164 | A1* | 11/2006 | Chung | H01L 23/4985 |
| | | | | 257/668 |
| 2008/0137166 | A1* | 6/2008 | Sah | G02F 1/13452 |
| | | | | 359/245 |
| 2010/0090995 | A1* | 4/2010 | Chung | G02F 1/13336 |
| | | | | 345/205 |
| 2013/0169558 | A1* | 7/2013 | Min | G09G 5/006 |
| | | | | 345/173 |
| 2013/0256002 | A1* | 10/2013 | Ozeki | C08L 77/00 |
| | | | | 174/251 |
| 2014/0246687 | A1* | 9/2014 | Ha | G06F 1/1626 |
| | | | | 257/88 |
| 2015/0138634 | A1* | 5/2015 | Kim | H04N 13/305 |
| | | | | 359/463 |
| 2015/0370113 | A1* | 12/2015 | Kim | G02F 1/13336 |
| | | | | 361/679.21 |
| 2016/0132281 | A1* | 5/2016 | Yamazaki | G06F 3/1446 |
| | | | | 345/1.3 |
| 2016/0198578 | A1* | 7/2016 | Du | H05K 5/0017 |
| | | | | 361/679.01 |
| 2016/0299387 | A1* | 10/2016 | Yamazaki | G02F 1/133345 |
| 2017/0017108 | A1* | 1/2017 | Shin | G09G 3/3406 |
| 2017/0025593 | A1* | 1/2017 | Bower | H01L 51/56 |
| 2017/0090260 | A1* | 3/2017 | Yu | G02F 1/13336 |
| 2017/0123133 | A1* | 5/2017 | Park | G02B 6/0078 |
| 2017/0140679 | A1* | 5/2017 | Tomoda | G09G 3/3208 |
| 2017/0148826 | A1 | 5/2017 | Choi | |
| 2017/0200780 | A1 | 7/2017 | Im et al. | |
| 2017/0249119 | A1* | 8/2017 | Ding | G06F 3/1446 |
| 2017/0303422 | A1* | 10/2017 | Lee | H05K 7/1417 |
| 2018/0005600 | A1* | 1/2018 | Ikeda | H01L 27/3232 |
| 2018/0033800 | A1* | 2/2018 | Koide | G06F 3/0445 |
| 2018/0149942 | A1* | 5/2018 | Harris | G02F 1/167 |
| 2018/0151539 | A1* | 5/2018 | Nakamura | H01L 27/3293 |
| 2018/0173036 | A1* | 6/2018 | Kim | G02F 1/13336 |
| 2018/0190631 | A1* | 7/2018 | Kim | G09G 3/3225 |
| 2018/0321766 | A1* | 11/2018 | Akimoto | G06F 3/0416 |
| 2018/0366664 | A1* | 12/2018 | Fujioka | H01L 27/3276 |
| 2019/0019436 | A1* | 1/2019 | Aoyagi | H01L 33/36 |
| 2019/0074299 | A1* | 3/2019 | Yamashita | G02F 1/134309 |
| 2019/0189729 | A1* | 6/2019 | Zhang | H01L 27/3276 |
| 2019/0312224 | A1* | 10/2019 | Oshige | G09G 3/3266 |
| 2019/0325789 | A1* | 10/2019 | Ting | G09G 3/32 |
| 2019/0327827 | A1* | 10/2019 | Chang | H01L 33/62 |
| 2019/0327843 | A1* | 10/2019 | Chang | H05K 5/0247 |
| 2020/0027945 | A1* | 1/2020 | Kim | H01L 27/3246 |
| 2020/0058730 | A1* | 2/2020 | Ha | H05K 5/0017 |
| 2020/0091273 | A1* | 3/2020 | Lee | H01L 27/3293 |
| 2020/0111771 | A1* | 4/2020 | Su | G06F 3/1446 |
| 2020/0119104 | A1* | 4/2020 | Chen | G09G 3/3225 |
| 2020/0161409 | A1* | 5/2020 | Sugisawa | H01L 27/3258 |
| 2020/0236213 | A1* | 7/2020 | He | G06F 1/1637 |

FOREIGN PATENT DOCUMENTS

| | | |
|---|---|---|
| CN | 104133307 A | 11/2014 |
| CN | 104851892 A | 8/2015 |
| JP | 2002040472 A | 2/2002 |
| JP | 2009162972 A | 7/2009 |
| KR | 100580824 B1 | 5/2006 |
| KR | 1020100069436 A | 6/2010 |
| KR | 1020150111808 A | 10/2015 |
| KR | 1020160006996 A | 1/2016 |
| KR | 1020170039030 A | 4/2017 |
| KR | 1020170071659 A | 6/2017 |

* cited by examiner

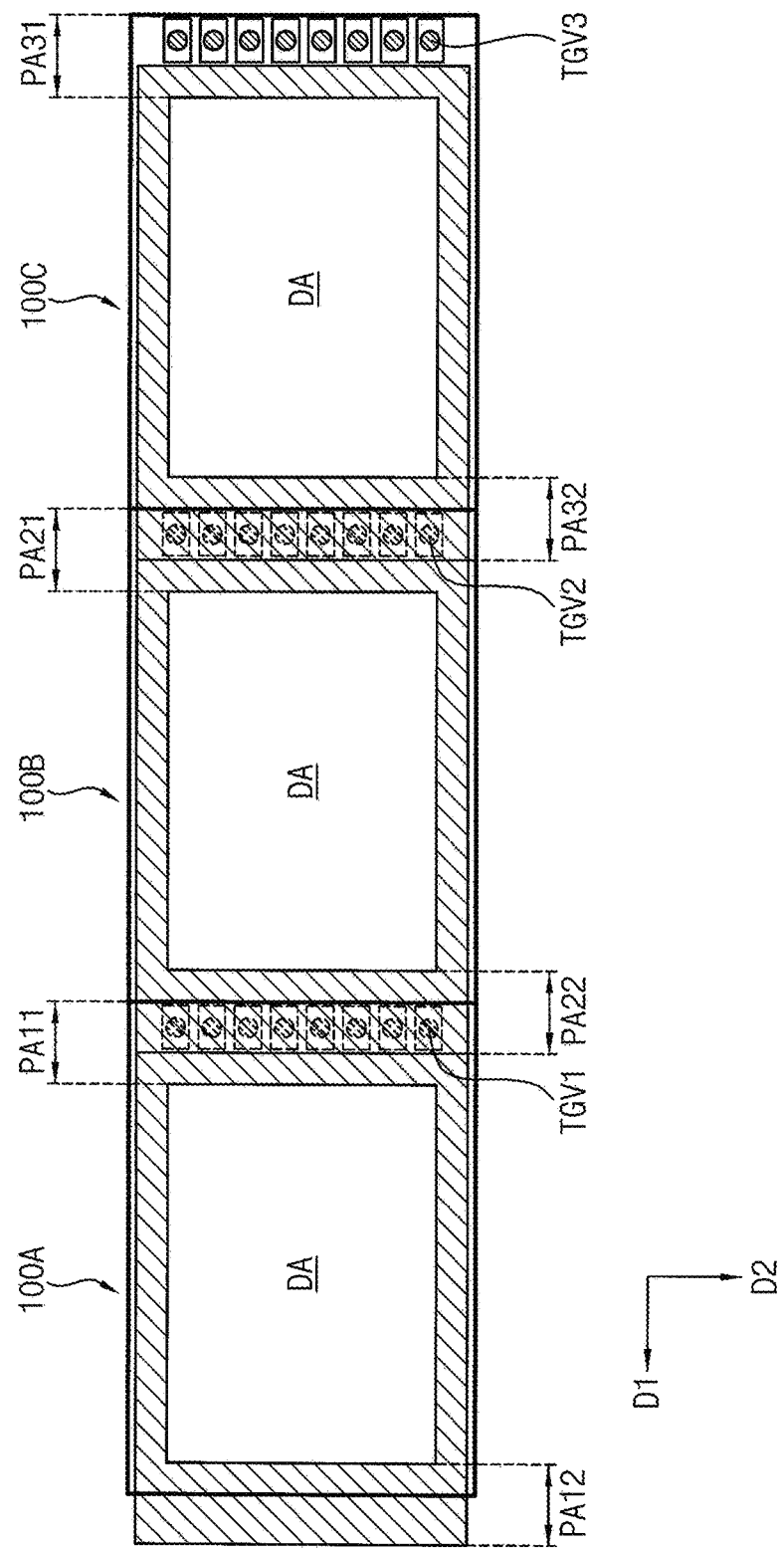

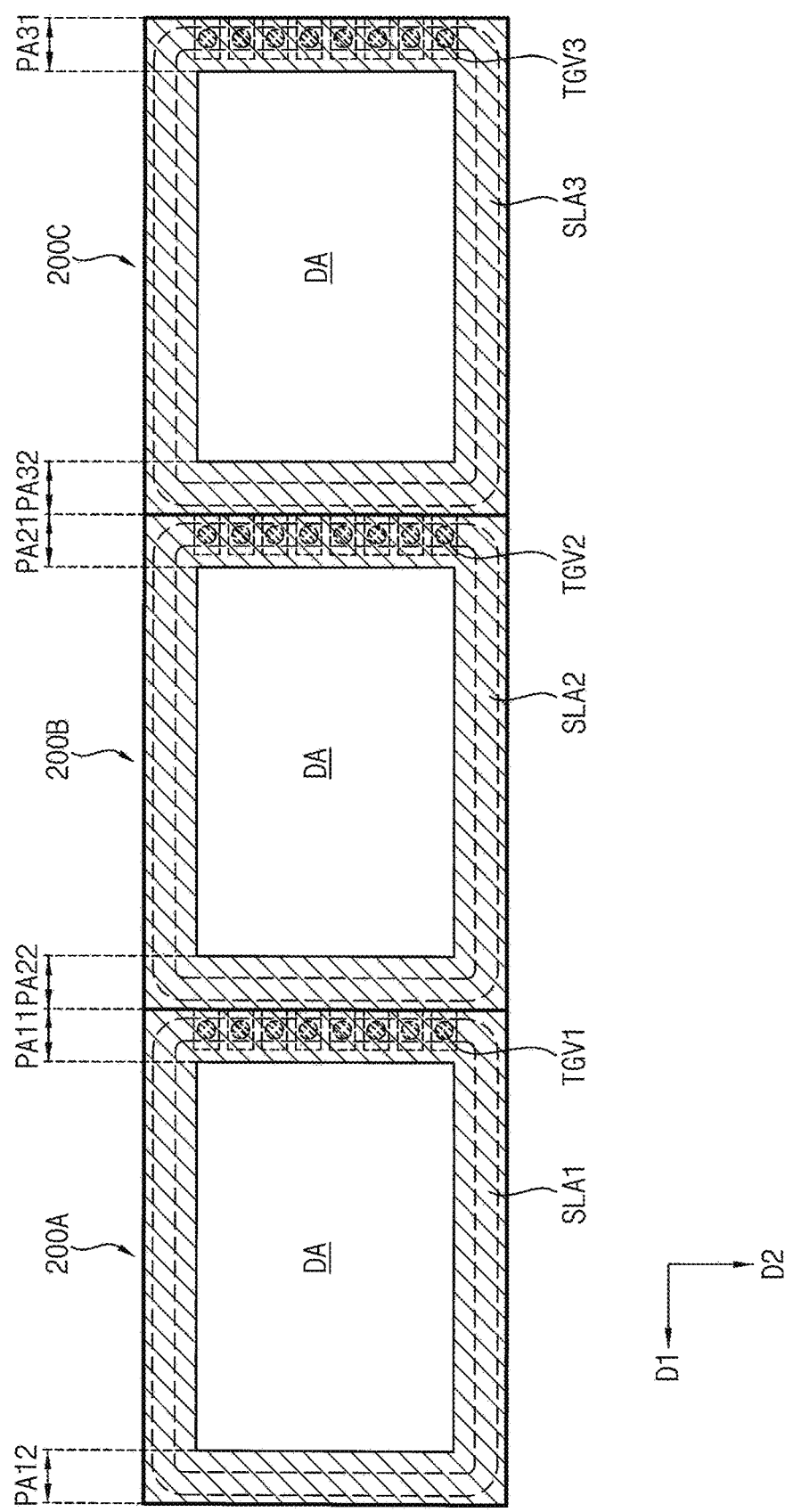

DISPLAY PANEL AND TILED DISPLAY APPARATUS HAVING THE SAME

This application claims priority to Korean Patent Application No. 10-2018-0171730, filed on Dec. 28, 2018, and all the benefits accruing therefrom under 35 U.S.C. § 119, the content of which in its entirety is herein incorporated by reference.

BACKGROUND

1. Field

The disclosure relates to a display panel with improved appearance quality and a tiled display apparatus including the display panel.

2. Description of the Related Art

Generally, a tiled display apparatus has a structure in which a plurality of display panel modules is connected to each other to realize a large screen.

Each of the display panel modules of the tiled display apparatus may include a display panel including a display area for displaying an image and a peripheral area surrounding the display area and a driving circuit for displaying an image on the display area. Accordingly, the peripheral area of the display panel module of the tiled display apparatus typically has a bezel width for an outer lead bonding ("OLB"). The display panel module has a structure in which a plurality of display panels may be connected. Accordingly, a boundary area of the display panels may have a bezel width.

SUMMARY

In a tiled display apparatus, the entire screen is divided into black or gray frames by the bezel width defined in the boundary area of the display panel module. As the boundary area is recognized, the display quality of the entire screen is deteriorated.

Embodiments of the invention provide a display panel with a reduced light shielding area corresponding to a boundary area between a plurality of display panels.

Embodiments of the invention provide a display apparatus including the display panel.

According to an embodiment of the invention, a display panel, which includes a display area in which a plurality of pixels is arranged and a plurality of peripheral areas surrounding the display area, includes a first substrate, a second substrate disposed opposite to the first substrate, a first external signal line disposed on the first substrate in a first peripheral area of plurality of peripheral areas and connected to an external device, and a first through-hole terminal including a conductive material filled in a hole defined through the first substrate in an area in which the first external signal line is disposed.

In an embodiment, the second substrate may be combined with the first substrate in a staggered structure to expose the first through-hole terminal.

In an embodiment, the plurality of peripheral areas may include a sealant area in which a sealing member, which combines the first and second substrates, is disposed, and the first through-hole terminal may be disposed in the sealant area.

According to an embodiment of the invention, a display panel, which includes a display area in which a plurality of pixels is arranged and a plurality of peripheral areas surrounding the display area, includes a first substrate including a first external signal line disposed in a first peripheral area of the plurality of peripheral areas and a second external signal line disposed in a second peripheral area of the plurality of peripheral areas, where the second peripheral area is disposed opposite to the first peripheral area, a second substrate combined with the first substrate, a first through-hole terminal including a conductive material filled in a hole defined through the second substrate and in contact with the first external signal line, a second through-hole terminal spaced apart from the first through-hole terminal and including a conductive material filled in a hole defined through the second substrate, and a third external signal line disposed on the second substrate and connected to the first and second through-hole terminals exposed on the second substrate.

According to an embodiment of the invention, a tiled display apparatus includes a plurality of display panels arranged in a matrix form, and a driving circuit unit which drives at least one of the plurality of display panels, where each of the plurality of display panels includes a substrate divided into a display area and a peripheral area surrounding the display area, an external signal line disposed in the peripheral area of the substrate and connected to an external device, and a through-hole terminal including a conductive material filled in a hole defined through the substrate in an area in which the external signal line is disposed.

In an embodiment, the driving circuit unit may include a flexible circuit film connected to the through-hole terminal exposed on a second surface opposite to a first surface of the substrate on which the external signal line is disposed, and a printed circuit board connected to the flexible circuit film.

In an embodiment, the substrate of the each of the plurality of display panels may include a first substrate including the through-hole terminal in a first peripheral area, and a second substrate which is combined and is staggered with the first substrate to expose the through-hole terminal.

In an embodiment, the first substrate of a first display panel of the plurality of display panels may overlap the second substrate of a second display panel of the plurality of display panels which is adjacent to the first peripheral area of the first display panel, and the second substrate of the first display panel overlaps the first substrate of a third display panel of the plurality of display panels, which is adjacent to a second peripheral area of the first display panel opposite to the first peripheral area of the first display panel.

In an embodiment, the peripheral area may include a sealant area in which a sealing member is disposed, and the through-hole terminal may be disposed in the sealant area.

In an embodiment, the substrate of the each of the plurality of display panels may include a first substrate including the through-hole terminal disposed in a first peripheral area and a second substrate combined with the first substrate, wherein the first substrate and the second substrate are combined in a non-staggered structure.

In an embodiment, the driving circuit unit may be connected to a display panel disposed at an outer side of a group of the plurality of display panels, which is arranged in one direction, and the driving circuit unit may provide a driving signal to the group of the plurality of display panels arranged in the one direction.

In an embodiment, the group of the plurality of display panels arranged in the one direction may include a first substrate including a first external signal line arranged in a first peripheral area and a second external signal line arranged in a second peripheral area facing the first peripheral area, a second substrate combined to the first substrate and including a third external signal line disposed in the first peripheral area, a first through-hole terminal disposed through the second substrate of an area where the third external signal line is disposed, and a second through hole terminal being spaced apart from the first through hole terminal and disposed through the second substrate of an area where the third external signal line is disposed.

In an embodiment, the driving circuit unit may include a flexible circuit film connected to the third external signal line of the display panel, and a printed circuit board connected to the flexible circuit film.

In an embodiment, the first substrate and the second substrate may be combined in a staggered structure to expose the second external signal line disposed in the second peripheral area of the first substrate and the second through-hole terminal disposed in the first peripheral area of the second substrate.

In an embodiment, the third external signal line may be disposed on a first surface of the second substrate, and the first through-hole terminal may be exposed to a second surface facing the first surface of the second substrate and in contact with the first external signal line.

In an embodiment, the second through-hole terminal may be exposed to the second surface of the second substrate, and may contact the second external signal line of the display panel adjacent to the display panel.

In an embodiment, a second substrate of a first display panel may overlap a first substrate of a second display panel adjacent to the first peripheral area of the first display panel, and a second substrate of the first display panel may overlap a first substrate of a third display panel adjacent to the second peripheral area of the first display panel.

In an embodiment, the second external signal line may include a first line layer extending from a display area and a peripheral area of the first substrate, a buffer layer disposed over the first line layer, and a second line layer disposed on the buffer layer and connected to the first line layer.

In an embodiment, the buffer layer may include an elastic material.

In an embodiment, the buffer layer may have a thickness in a range of about 50 micrometers (μm) to about 100 μm.

According to the embodiments, in the tiled display apparatus, the plurality of through-hole terminals is disposed in a peripheral area of a display panel, and the plurality of through-hole terminals is connected to a driving circuit unit. In addition, the plurality of through-hole terminals is disposed in a peripheral area of a display panel, and adjacent display panels are electrically connected through the plurality of through-hole terminals. Thus, a plurality of display panels arranged in one direction can be driven by using a single driving circuit unit. Therefore, in the tiled display apparatus, the shielding area corresponding to the boundary between the display panel and the display panel may be reduced, and the overall bezel width of the tiled display apparatus may be reduced.

BRIEF DESCRIPTION OF THE DRAWINGS

The above and other features of the invention will become more apparent by describing in detailed embodiments thereof with reference to the accompanying drawings, in which:

FIGS. 3A and 3B are a plain view and a sectional view illustrating a tiled display apparatus including a plurality of display panel modules according to an embodiment;

FIGS. 5A and 5B are a plain view and a sectional view illustrating a tiled display apparatus including a plurality of display panel modules according to an embodiment;

DETAILED DESCRIPTION

Figure 1:
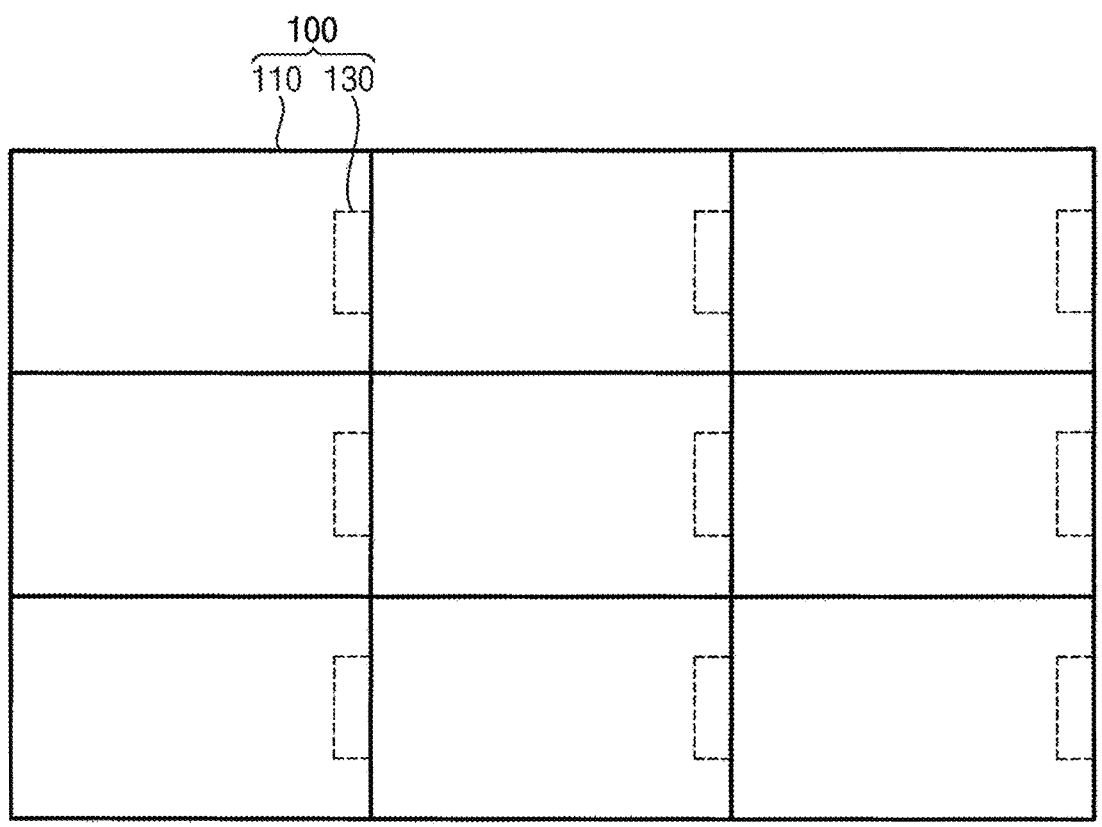
FIG. 1 is a plain view illustrating a tiled display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a plain view illustrating a tiled display apparatus according to an embodiment.

Referring to FIG. 1, an embodiment of the tiled display apparatus may include a plurality of display panel modules 100.

The plurality of display panel modules 100 is arranged in a matrix form. In an embodiment, as shown in FIG. 1, the plurality of display panel modules 100 may be arranged in a matrix form with three rows and three columns. In one alternative embodiment, for example, the matrix form may include a single row and a plurality of columns.

Each of the plurality of display panel modules 100 includes a display panel 110 and a driving circuit unit 130 for driving the display panel 110.

The display panel 110 includes a first substrate (lower substrate) and a second substrate (upper substrate) opposite the first substrate. The display panel 110 includes a display area in which a plurality of pixels is arranged and a peripheral area surrounding the display area. The display panel 110 may be an organic light emitting display panel including an organic light emitting diode. Alternatively, the display panel 110 may be a liquid crystal display panel including a liquid crystal capacitor.

In an embodiment, the driving circuit unit 130 may be disposed on a back surface of the display panel 110. In an embodiment, where the display panel 110 is an organic light emitting display panel, the driving circuit unit 130 may be disposed on the back surface of the display panel 110. In an alternative embodiment, where the display panel 110 is a liquid crystal display panel, the driving circuit unit 130 may be disposed on a back surface of a backlight assembly disposed below the display panel. The driving circuit unit 130 provides a plurality of driving signals to the display panel 110. The driving signals may include a data driving signal to drive a data line and a scan driving signal to drive a scan line.

Figure 2A:
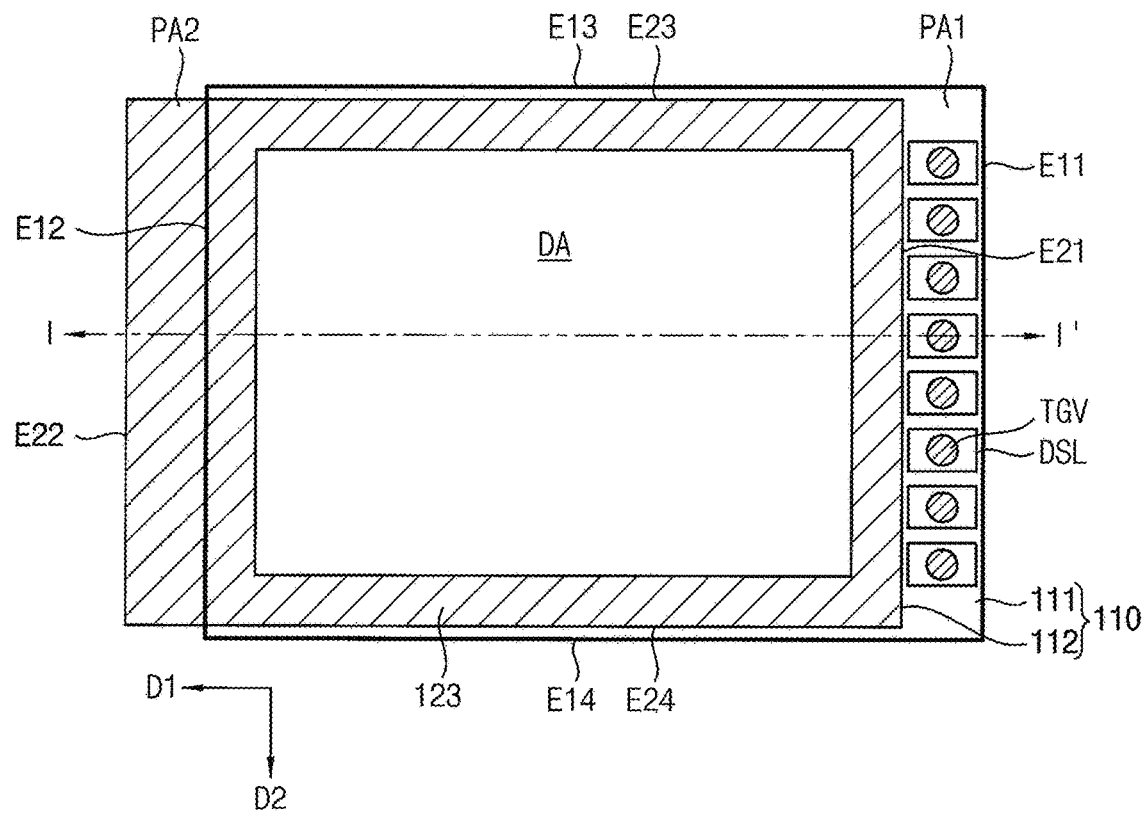
FIG. 2A is a plain view illustrating a display panel module according to an embodiment.
Figure 2B:
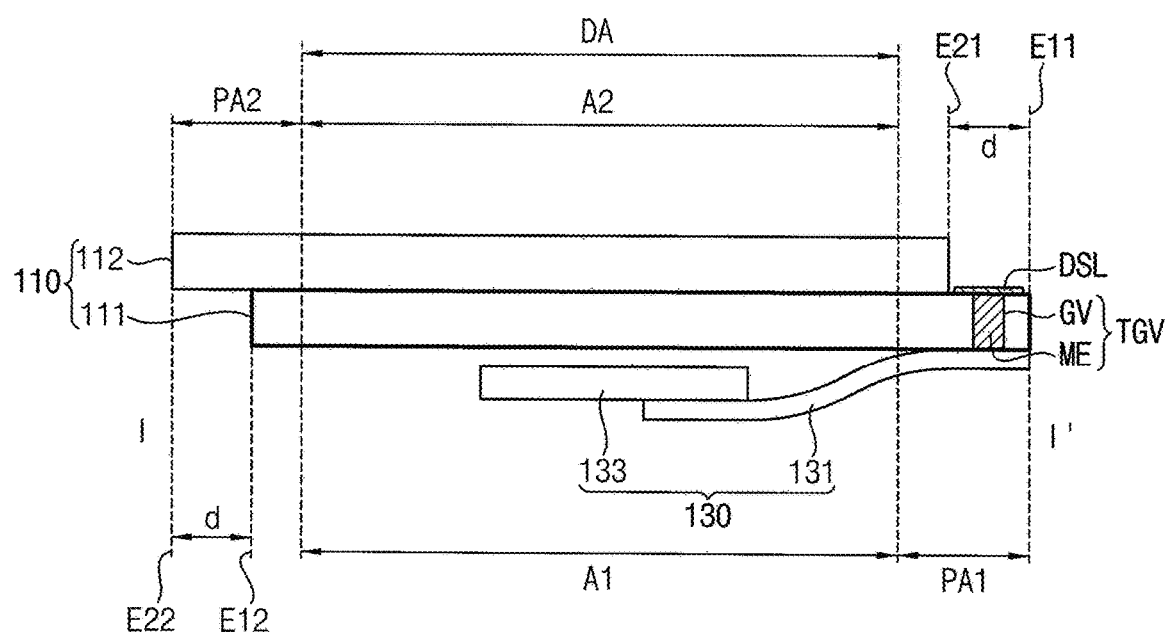
FIG. 2B is a sectional view of the display panel module taken along line I-I' in FIG. 2A.

FIG. 2A is a plain view illustrating a display panel module according to an embodiment. FIG. 2B is a sectional view of the display panel module taken along line I-I in FIG. 2A.

Referring to FIGS. 2A and 2B, an embodiment of the display panel module 100 includes a display panel 110 and a driving circuit unit 130.

The display panel 110 includes a lower substrate 111 and an upper substrate 112. The display panel 110 includes a display area DA in which a plurality of pixels is arranged.

The lower substrate 111 includes four edge (or side) portions E11, E12, E13 and E14, and includes a first area A1 and a first peripheral area PA1.

The first area A1 may correspond to the display area DA.

The first peripheral area PA1 is defined at an edge portion of the first area A1 adjacent to a first edge portion E11 of the edge portions E11, E12, E13 and E14 of the lower substrate 111.

A plurality of external signal lines DSL and a plurality of through-hole terminals TGV are arranged in a first peripheral area PA1 of the lower substrate 111.

The plurality of external signal lines DSL may transfer a plurality of driving signals for driving a plurality of signal lines arranged in the display area DA.

The plurality of external signal lines DSL is arranged in a first direction (horizontal direction) D1, and a second direction (vertical direction) D2 crossing the first direction D1.

In an embodiment, the plurality of through-hole terminals TGV is arranged in the vertical direction D2 in the areas where the plurality of external signal lines DSL is disposed. The plurality of through-holes terminals TGV includes a plurality of through-holes GV defined through the lower substrate 111 of the first peripheral area PA1, in which the plurality of external signal lines DSL is disposed, and an electrode terminal ME filled with or coated with a conductive material in the plurality of through-holes GV. The conductive material may be a metallic material such as copper.

The upper substrate 112 is staggered in the horizontal direction D1 with respect to the lower substrate 111 to expose the plurality of through-hole terminals TGV disposed in the first peripheral area PA1 when viewed from a plan view in a thickness direction of the upper substrate 112 or in a direction perpendicular to the first and second direction D1 and D2.

The upper substrate 112 includes four edge (or side) portions E21, E22, E23, and E24. The upper substrate 112 and includes a second area A2 and a second peripheral area PA2.

The second area A2 corresponds to the display area DA.

The second peripheral area PA2 is defined at the edge portion of the second area A2 adjacent to the second edge portion E22 of the edge portions E21, E22, E23 and E24 of the upper substrate 112.

The second edge portion E22 of the upper substrate 112 faces the first edge portion E21 of the upper substrate 112. The first edge portion E21 of the upper substrate 112 is adjacent to the first edge portion E11 of the lower substrate 111. The second edge portion E22 of the upper substrate 112 is adjacent to the second edge portion E12 of the lower substrate 111.

The first edge portion E21 of the upper substrate 112 is spaced from the first edge portion E11 of the lower substrate 111 to the first area A1 side of the lower substrate 111. The first edge E21 of the upper substrate 112 and the first edge E11 of the lower substrate 111 are spaced apart from each other with a distance d when viewed from the plan view.

The first peripheral area PA1 of the lower substrate 111 is protruded by the distance d (hereinafter, separation distance) with respect to the upper substrate 112. The first peripheral area PA1 of the lower substrate 111 is defined by an area of the lower substrate 111 that extends from the upper substrate 112 by the separation distance d when viewed from a plan view in a thickness direction of the display panel module 100, as shown in FIG. 2A. The second peripheral area PA2 of the upper substrate 112 is protruded by the separation distance d with respect to the lower substrate 111.

The plurality of through-hole terminals TGV which is arranged in the first peripheral area PA1 of the lower substrate 111 may be exposed by the separation distance d between the upper substrate 112 and the lower substrate 111.

The upper substrate 112 may include a shielding pattern 123. The shielding pattern 123 defines the display area DA and may be disposed in a peripheral area surrounding the second area A2 corresponding to the display area DA.

The driving circuit unit 130 includes a flexible circuit film 131 and a printed circuit board 133.

In an embodiment, the flexible circuit film 131 includes a first ends portion connected to the plurality of through-hole terminals TGV disposed in the first peripheral area PA1 of the lower substrate 111 and a second end portion connected to the printed circuit board 133. The first end portion of the flexible circuit film 131 is connected to the through-hole terminal TGV protruded from a second surface opposite to a first surface of the lower substrate 111 where the external signal line DSL is disposed.

The first end portion of the flexible circuit film 131 may be connected to the plurality of through-hole terminals TGV by a conductive adhesive member such as an anisotropic conductive film or the like. The second end portion of the flexible circuit film 131 may be connected to the printed circuit board 133 by the conductive adhesive member.

A driving circuit is disposed or mounted on the printed circuit board 133 and the printed circuit board 133 is connected to the flexible circuit film 131. The printed circuit board 133 may be disposed on the back surface of the lower substrate 111 via the flexible circuit film 131 having flexibility.

In an embodiment, as described above, the driving circuit unit is connected to the back of the display panel through a plurality of through-hole terminals disposed or formed in the peripheral area of the display panel. Accordingly, the outer lead bonding ("OLB") area for connection with the driving circuit unit may be omitted in the peripheral area of the display panel and the peripheral area width of the display panel may be reduced. Therefore, the width of shielding area such as black or gray area may be reduced in boundary area between display panels in the tiled display apparatus. In such an embodiment, an overall bezel width of the tiled display apparatus may be reduced.

Figure 3B:
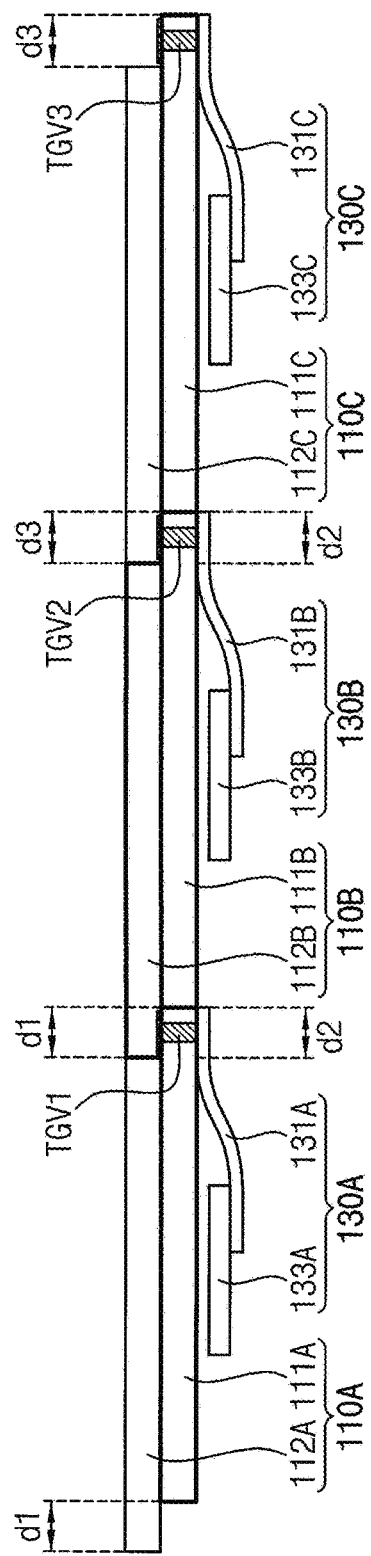

FIGS. 3A and 3B are a plain view and a sectional view illustrating a tiled display apparatus including a plurality of display panel modules according to an embodiment.

Referring to FIGS. 3A and 3B, an embodiment of the tiled display apparatus may include a first display panel module 100A, a second display panel module 100B and a third display panel module 100C.

In such an embodiment, the first display panel module 100A may include a first display panel 110A and a first driving circuit unit 130A.

The first display panel 110A includes a first lower substrate 111A and a first upper substrate 112A. The first lower substrate 111A includes a plurality of first through-hole terminals TGV1 arranged in a vertical direction D2 in a first peripheral area PA11. The first upper substrate 112A is staggered by a first separation distance d1 in the horizontal direction D1 with respect to the first lower substrate 111A to expose the plurality of first through-hole terminals TGV1 of the first lower substrate 111A.

The first driving circuit unit 130A includes a first flexible circuit film 131A connected to the plurality of first through-hole terminals TGV1 and a first printed circuit board 133A which is connected to the first flexible circuit film 131A and disposed on a back surface of the first printed circuit board 133A.

In such an embodiment, the second display panel module 100B includes a second display panel 110B and a second driving circuit unit 130B.

The second display panel 110B includes a second lower substrate 111B and a second upper substrate 112B. The second lower substrate 111B includes a plurality of second through-hole terminals TGV2 arranged in a vertical direction D2 in a first peripheral area PA21. The second upper substrate 112B is staggered by a second separation distance d2 in the horizontal direction D1 with respect to the second lower substrate 111B to expose a second plurality of through-hole terminals TGV2 of the second lower substrate 111B.

The second driving circuit unit 130B includes a second flexible circuit film 131B connected to the plurality of second through-hole terminals TGV2 and a second printed circuit board 133B which is connected to the second flexible circuit film 131B and disposed on the back surface of the second lower substrate 111B.

In such an embodiment, the third display panel module 100C includes a third display panel 110C and a third driving circuit unit 130C.

The third display panel 110C includes a third lower substrate 111C and a third upper substrate 112C. The third lower substrate 111C includes a plurality of third through-hole terminals TGV3 arranged in the vertical direction D2 in a first peripheral area PA31. The third upper substrate 112C is staggered by a third separation distance d3 in the horizontal direction D1 with respect to the third lower substrate 111C to expose a plurality of third through-hole terminals TGV3 of the third lower substrate 111C.

The third driving circuit unit 130C includes a third flexible circuit film 131C connected to the plurality of third through-hole terminals TGV3 and a third printed circuit board 133C which is connected to the third flexible circuit film 131C and disposed on the back surface of the third lower substrate 111C.

In such an embodiment, the first lower substrate 111A of the first display panel module 100A protrudes from the first upper substrate 112A by the first separation distance d1. The first upper substrate 112A is protruded from the first lower substrate 111A by the first separation distance d1.

In the second display panel module 100B, the first peripheral area PA21 of the second lower substrate 111B is protruded by the second separation distance d2 with respect to the second upper substrate 112B. The second peripheral area PA22 of the second upper substrate 112B is protruded by the second separation distance d2 with respect to the second lower substrate 111B. The first separation distance d1 and the second separation distance d2 are substantially equal to each other.

In the third display panel module 100C, the first peripheral area PA31 of the third lower substrate 111C is protruded by the third separation distance d3 from the third upper substrate 112C. The second peripheral area PA32 of the third upper substrate 112C is protruded by the third separation distance d3 with respect to the third lower substrate 111C. The second separation distance d2 and the third separation distance d3 are substantially equal to each other.

The second lower substrate 111B of the second display panel module 100B protruded by the second separation distance d2 overlaps the third upper substrate 112C of the third display panel module 100C protruded by the third separation distance d3.

The second upper substrate 112B of the second display panel module 100B, which is protruded by the second separation distance d2 overlaps the first lower substrate 111A of the first display panel module 100A protruded by the first separation distance d1.

The first peripheral area PA21 of the second display panel module 100B overlaps and is connected to the second peripheral area PA32 of the third display panel module 100C. The second peripheral area PA22 of the second display panel module 100B overlaps the first peripheral area PA11 of the first display panel module 100A.

Figure 4A:
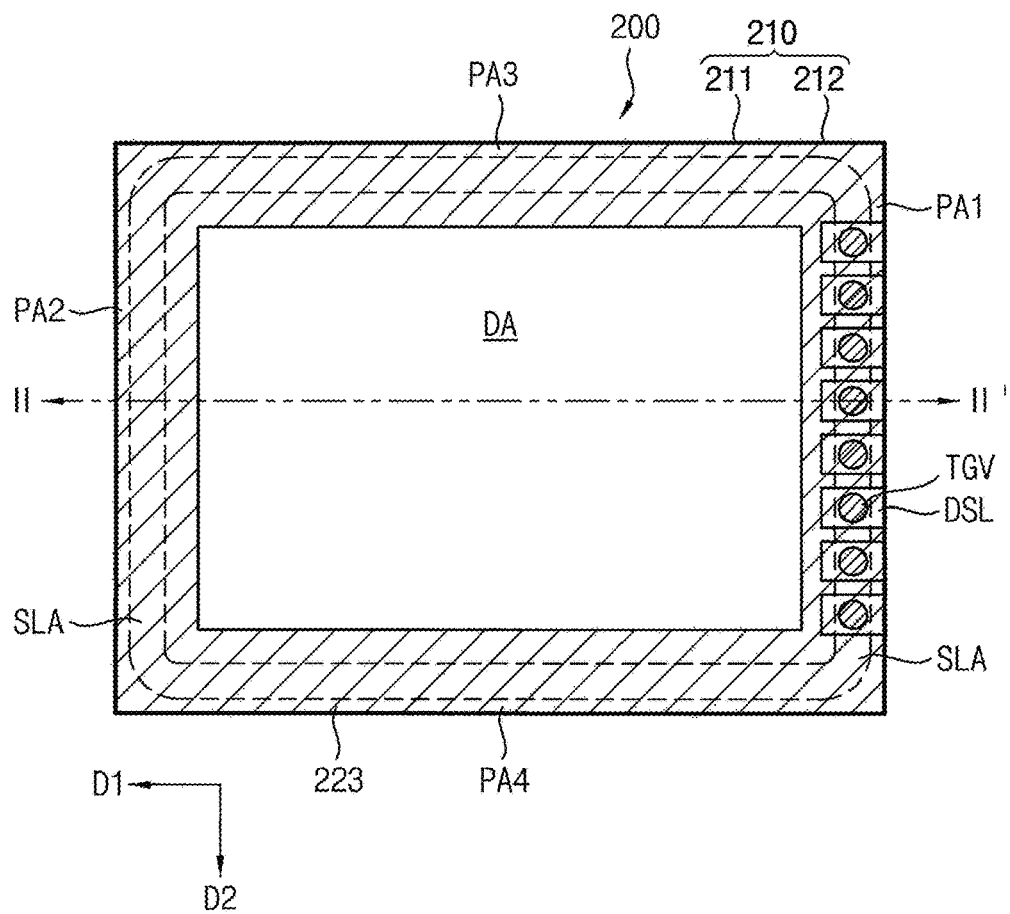
FIG. 4A is a plain view illustrating a display panel module according to an alternative embodiment.
Figure 4B:
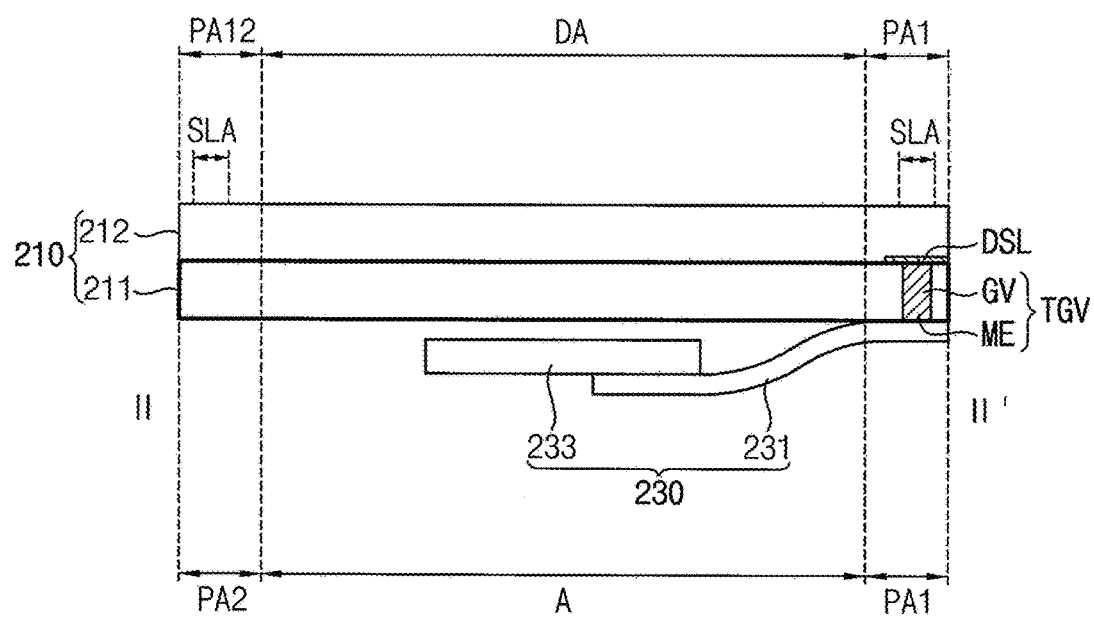
FIG. 4B is a sectional view illustrating the display panel module taken along line II-II' in FIG. 4A.

In an embodiment, as described above, each of the plurality of display panel modules having a staggered structure may overlap the upper substrate and the lower substrate of the display panels disposed adjacent thereto, e.g., on a left side or right side in the horizontal direction FIG. 4A is a plain view illustrating a display panel module according to an alternative embodiment. FIG. 4B is a sectional view illustrating the display panel module taken along line II-II' in FIG. 4A.

Referring to FIGS. 4A and 4B, an embodiment of the display panel module 200 may include a display panel 210 and a driving circuit unit 230.

The display panel 210 may include a lower substrate 211 and an upper substrate 212. The display panel 210 may include a display area DA in which a plurality of pixels is arranged.

The lower substrate 211 may include an area A corresponding to the display area DA. The lower substrate 211 may include a first peripheral area PA1, a second peripheral area PA2, a third peripheral area PA3 and a fourth peripheral area PA4 which surrounds four sides of the area A.

The first, second, third and fourth peripheral areas PA1, PA2, PA3 and PA4 may include a sealant area SLA. The sealant area SLA is an area where a sealing member (sealant) for combing the upper substrate 212 and the lower substrate 211 to each other is disposed.

A plurality of external signal lines DSL and a plurality of through-hole terminals TGV are arranged in the first peripheral area PA1 of the lower substrate 111. The plurality of through-hole terminals TGV may be located in the sealant area SLA in the first peripheral area PA1.

The plurality of external signal lines DSL transfers a plurality of driving signals for driving a plurality of signal lines arranged on the display panel 110. The plurality of signal lines may include a plurality of data lines, a plurality of scan lines, and a plurality of voltage lines.

The plurality of external signal lines DSL extends in the horizontal direction D1 and is arranged in the vertical direction D2 which crosses the horizontal direction D1.

In an embodiment, the plurality of through-hole terminals TGV is arranged in the vertical direction D2 in areas where the plurality of external signal lines DSL is arranged. The plurality of through-hole terminals TGV includes a plurality of through-holes GV and an electrode terminal ME. The plurality of through-holes GV is defined through the lower substrate 211 of the first peripheral area PA1 in which the plurality of external signal lines DSL is disposed. The electrode terminal ME may be filled or coated with a conductive material in the plurality of through-holes GV. The conductive material may be a metallic material such as copper.

The upper substrate 212 may be combined with the lower substrate 211 by the sealing member. In such an embodiment, the upper substrate 212 has a non-staggered structure with respect to the lower substrate 211.

The upper substrate 212 may include a shielding pattern 223. The shielding pattern 223 may define the display area DA and be disposed in a peripheral area surrounding the second area A2 corresponding to the display area DA.

The driving circuit unit 230 includes a flexible circuit film 231 and a printed circuit board 233.

In an embodiment, the flexible circuit film 231 includes a first end portion and a second end portion. The first end portion of the flexible circuit film 231 is connected to the plurality of through-hole terminals TGV disposed in the first peripheral area PA1 of the lower substrate 211. The second end portion of the flexible circuit film 231 is connected to the printed circuit board 233.

The first end portion of the flexible circuit film 231 may be connected to the plurality of through-hole terminals TGV by a conductive adhesive member such as an anisotropic conductive film or the like. The second end portion of the flexible circuit film 231 may be connected to the printed circuit board 233 by the conductive adhesive member.

A driving circuit is disposed or mounted on the printed circuit board 233, and the printed circuit board 233 is connected to the flexible circuit film 231. The printed circuit board 233 may be disposed on the back surface of the lower substrate 211 due to a flexibility of the flexible circuit film 231.

In such an embodiment, as described above, the driving circuit unit is connected at the back surface of the display panel to the plurality of external signal lines DSL by the plurality of through-hole terminals disposed or formed in the peripheral area of the display panel. An OLB area for connection with the driving circuit unit may be omitted in the peripheral area of the display panel. Thus, the peripheral area width of the display panel may be reduced. Therefore, the width of the shielding area such as a black or a gray area in the boundary area between the display panels in the tiled display apparatus may be reduced. Accordingly, in such an embodiment, the overall bezel width of the tiled display apparatus may be reduced.

Figure 5B:
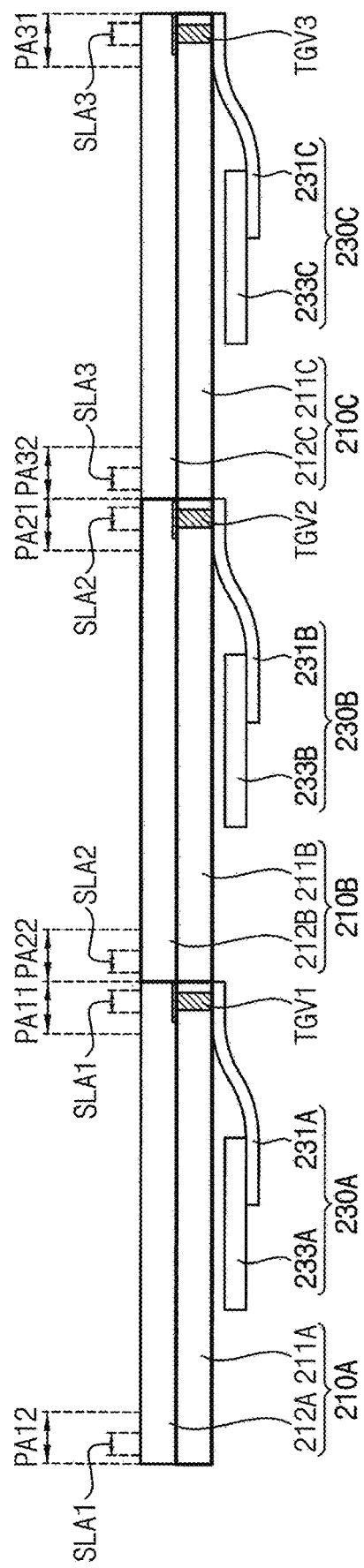

FIGS. 5A and 5B are a plain view and a sectional view illustrating a tiled display apparatus including a plurality of display panel modules according to an embodiment.

Referring to FIGS. 5A and 5B, an embodiment of the tiled display apparatus may include a first display panel module 200A, a second display panel module 200B and a third display panel module 200C.

The first display panel module 200A may include a first display panel 210A and a first driving circuit unit 230A.

The first display panel 210A includes a first lower substrate 211A and a first upper substrate 212A. The first lower substrate 211A includes a plurality of first through-hole terminals TGV1 arranged in a vertical direction D2 in a first peripheral area PA11. The first upper substrate 212A is combined with the first lower substrate 211A by a sealing member. The plurality of first through-hole terminals TGV1 is disposed in the first sealant area SLA1 of the first peripheral area PA11 where the sealing member is disposed. The first lower substrate 211A is combined with the first upper substrate 212A in a non-staggered structure.

The first driving circuit unit 230A includes a first flexible circuit film 231A and a first printed circuit board 233A. The first flexible circuit film 231A is connected to the plurality of first through-hole terminals TGV1. The first printed circuit board 233A is connected to the first flexible circuit film 231A and disposed on the back surface of the first lower substrate 211A.

The second display panel 210B includes a second lower substrate 211B and a second upper substrate 212B. The second lower substrate 211B includes a plurality of second through-hole terminals TGV2 arranged in a vertical direction D2 in a first peripheral area PA21. The second upper substrate 212B is combined with the second lower substrate 211B by a sealing member. The plurality of second through-hole terminals TGV2 is located in the second sealant area SLA2 of the first peripheral area PA21 where the sealing member is disposed. The second lower substrate 211B is combined with the second upper substrate 212B in a non-staggered structure.

The second driving circuit unit 230B includes a second flexible circuit film 231B and a second printed circuit board 233B. The second flexible circuit film 231B is connected to the plurality of second through-hole terminals TGV2. The second printed circuit board 233B is connected to the second flexible circuit film 231B and disposed on the back surface of the second lower substrate 211B.

The third display panel 210C includes a third lower substrate 211C and a third upper substrate 212C. The third lower substrate 211C includes a plurality of third through-hole terminals TGV3 arranged in a vertical direction D2 in a first peripheral area PA31. The third upper substrate 212C is combined with the third lower substrate 211C by a sealing member. The plurality of third through-hole terminals TGV3 are disposed in the third sealant area SLA3 of the first peripheral area PA31 where the sealing member is disposed. The third lower substrate 211C is combined to the third upper substrate 212C in a non-staggered structure.

The third driving circuit unit 230C includes a third flexible circuit film 231C and a third printed circuit board 233C. The third flexible circuit film 231C is connected to the plurality of third through-hole terminals TGV3. The third printed circuit board 233C is connected to the third flexible circuit film 231C and disposed on the back surface of the third lower substrate 211C.

In an embodiment, as shown in FIGS. 5A and 5B, the connection structures of the first, second, and third display panel modules 200A, 200B, and 200C may be sequentially connected.

In such an embodiment, the first display panel module 200A is disposed adjacent to the second display panel module 200B.

The second peripheral area PA22 of the second display panel module 200B is disposed adjacent to the first peripheral area PA11 of the first display panel module 200A.

The second peripheral area PA32 of the third display panel module 200C is arranged adjacent to the first peripheral area PA21 of the second display panel module 200B.

In such an embodiment, as described above, the plurality of display panel modules having the non-staggered structure may be sequentially arranged.

Figure 6:
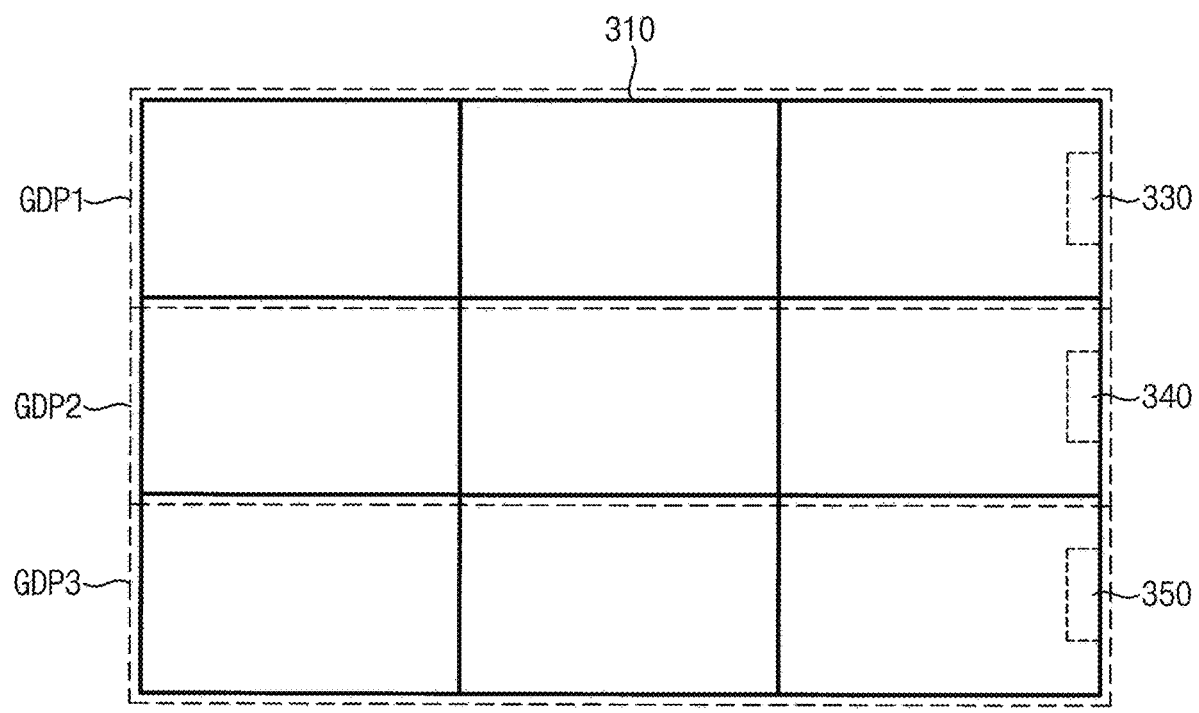
FIG. 6 is a plain view illustrating a tiled display apparatus according to another alternative embodiment.

FIG. 6 is a plain view illustrating a tiled display apparatus according to another alternative embodiment.

Referring to FIG. 6, an embodiment of the tiled display apparatus may include a plurality of display panels 310 and a plurality of group driving circuit units 330, 340 and 350.

The plurality of display panels 310 is arranged in a matrix form. In one embodiment, for example, the matrix form may include a single row and a plurality of columns.

The plurality of display panels 310 may be divided into a plurality of groups GDP1, GDP2 and GDP3. Each of a plurality of groups GDP1, GDP2, and GDP3 includes a plurality of display panels 310 arranged in a horizontal direction D1.

The first group driving circuit unit 330 generates driving signals for driving the display panels 310 of a first group GDP1 of the plurality of groups GDP1, GDP2 and GDP3. The first group driving circuit unit 330 may be disposed on a back surface of the display panel 310 located outside the display panels 310 of the first group GDP1.

The second group driving circuit unit 340 generates driving signals for driving the display panels 310 of the second group GDP2 of the plurality of groups GDP1, GDP2 and GDP3. The second group driving circuit unit 340 may be disposed on a back surface of the display panel 310 located outside of the display panels 310 of the second group GDP2.

The third group driving circuit unit 350 generates driving signals for driving the display panels 310 of the third group GDP3 of the plurality of groups GDP1, GDP2 and GDP3. The third group driving circuit unit 350 may be disposed on a back surface of the display panel 310 located outside the display panels 310 of the third group GDP3. A display panel 310 may include an upper substrate and a lower substrate. The display panel 310 includes a display area, in which a plurality of pixels is arranged, and a peripheral area surrounding the display area. The display panel 310 may be an organic light emitting display panel including an organic light emitting diode. Alternatively, the display panel 110 may be a liquid crystal display panel including a liquid crystal capacitor.

The plurality of group driving circuit units 330, 340 and 350 may be disposed on a back surface of the display panel 310. In an embodiment, where the display panel 310 is an organic light emitting display panel, a plurality of group driving circuit units 330, 340, and 350 may be disposed on a back surface of the display panel 310. In an alternative embodiment, where the display panel 310 is a liquid crystal display panel, the plurality of group driving circuit units 330, 340, and 350 may be disposed on a back surface of the backlight assembly. The plurality of group driving circuit units 330, 340, and 350 provides a plurality of driving signals to the plurality of group display panels 310, respectively. The plurality of driving signal may include a data driving signal to drive the data line of the display panel 310 and a scan driving signal to drive the scan line of the display panel 310.

Figure 7A:
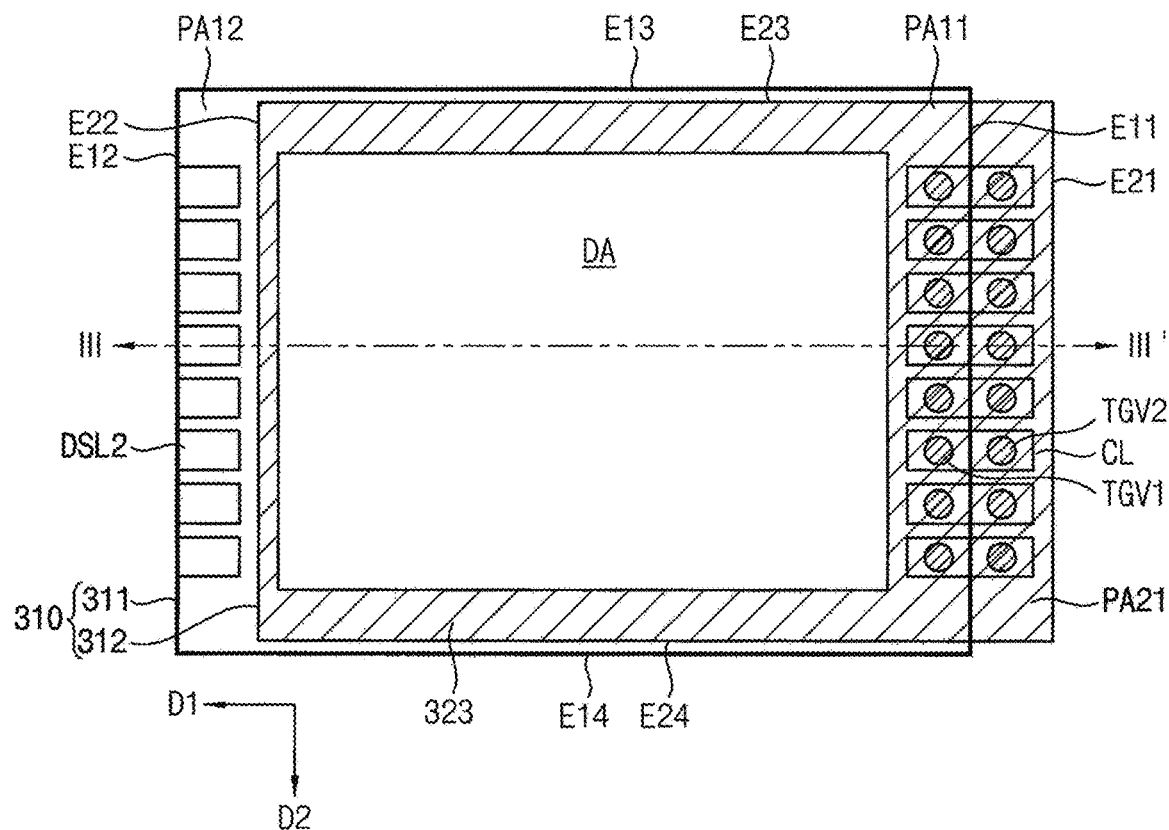
FIG. 7A is a plain view illustrating a display panel shown in FIG. 6.
Figure 7B:
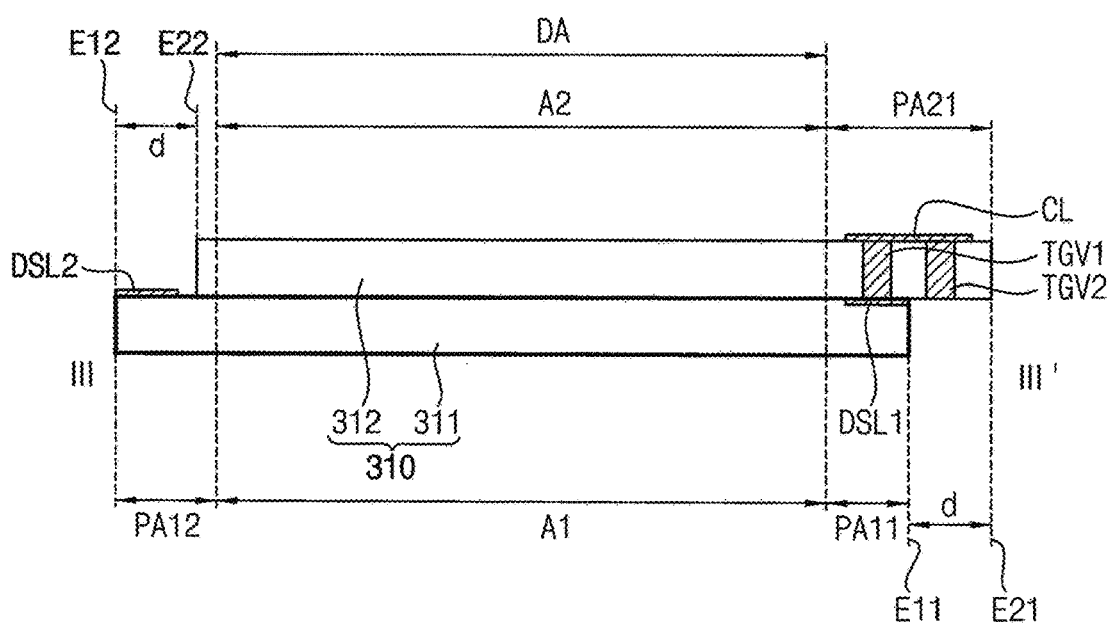
FIG. 7B is a sectional view illustrating the display panel taken along line III-III' in FIG. 7A.

FIG. 7A is a plain view illustrating a display panel shown in FIG. 6. FIG. 7B is a sectional view illustrating the display panel taken along line III-III' in FIG. 7A.

Referring to FIGS. 7A and 7B, an embodiment of the display panel 310 may include a lower substrate 311 and an upper substrate 312. The display panel 310 may include a display area DA in which a plurality of pixels is arranged.

The lower substrate 111 may include four edge portions E11, E12, E13 and E14. The lower substrate 111 may include a first area A1, a first peripheral area PA11 and a second peripheral area PA12.

The first area A1 corresponds to the display area DA.

The first peripheral area PA11 is defined at the edge portion of the first area A1 adjacent to a first edge portion E11 of the edge portions E11, E12, E13, and E14 of the lower substrate 111.

A plurality of first external signal lines DSL1 is arranged in the first peripheral area PA11 of the lower substrate 311.

The plurality of first external signal lines DSL1 is disposed on the upper substrate 312 and transfers a plurality of driving signals. The plurality of first external signal lines DSL may extend in a horizontal direction D1 and be arranged in a vertical direction D2 crossing the horizontal direction D1.

The second peripheral area PA12 is defined at the edge portion of the first area A1 adjacent to a second edge portion E12 opposite to the first edge portion E11 among the edge portions E11, E12, E13 and E14 of the lower substrate 311.

The plurality of second external signal line DSL2 is arranged in the second peripheral area PA12 of the lower substrate 311.

The plurality of second external signal lines DSL2 is disposed on the upper substrate of a display panel adjacent to the display panel 310 and transfers a plurality of driving signals. The plurality of first external signal lines DSL may extend in a horizontal direction D1 and be arranged in a vertical direction D2 crossing the horizontal direction D1.

The upper substrate 312 is disposed in a staggered structure with respect to the lower substrate 311. In such an embodiment, as shown in FIGS. 7A and 7B, the lower substrate 311 is staggered in the horizontal direction D1 with respect to the upper substrate 312.

The upper substrate 312 may include four edge portions E21, E22, E23 and E24. The upper substrate 312 may include a second area A2 and a first peripheral area PA21.

The second area A2 corresponds to the display area DA.

The first peripheral area PA21 may be defined at an edge portion of the second area A2 adjacent to a second edge portion E22 among the edge portions E21, E22, E23 and E24 of the upper substrate 212.

A plurality of first through-hole terminals TGV1, a plurality of second through-hole terminals TGV2 and a plurality of third external signal line CL are arranged in a first peripheral area PA21 of the upper substrate 312.

The plurality of first through-hole terminals TGV1 is connected to the plurality of first external signal lines DSL1. The plurality of first through-hole terminals TGV1 includes a plurality of first through-holes and a plurality of first electrode terminals. The plurality of through-holes is defined through the first peripheral area PA21 of the upper substrate 312. The first electrode terminals are filled or coated with a conductive material in the plurality of first through-holes, respectively. The conductive material may be a metallic material such as copper.

The plurality of second through-hole terminals TGV2 are a plurality of second through-holes and a plurality of second electrode terminals. The plurality of the second through-holes TGV2 is defined through the first peripheral area PA21 of the upper substrate 312 spaced apart from the plurality of first through-hole terminals TGV1. The second electrode terminals are filled or coated with conductive material in the plurality of second through-holes, respectively.

The plurality of third external signal lines CL connects the plurality of first through-hole terminals TGV1 to the plurality of second through-hole terminals TGV2, respectively. The plurality of third external signal lines CL is arranged on a second surface opposite to a first surface facing the lower substrate 311.

The second edge portion E22 of the upper substrate 212 faces a first edge portion E21 of the upper substrate 312. The first edge portion E21 of the upper substrate 312 is adjacent to a first edge portion E11 of the lower substrate 311. The second edge portion E22 of the upper substrate 312 is adjacent to a second edge portion E12 of the lower substrate 311.

The first edge portion E21 of the upper substrate 312 is spaced apart from the first edge portion E11 of the lower substrate 311 by a separation distance d. The second edge portion E12 of the lower substrate 311 is spaced apart from the second edge portion E22 of the upper substrate 312 by the separation distance d.

The first peripheral area PA21 of the upper substrate 312 is protruded by the separation distance d with respect to the lower substrate 311. The second peripheral area PA12 of the lower substrate 311 is protruded by the separation distance d with respect to the upper substrate 312.

The upper substrate 312 may include a shielding pattern 323. A second area A2 corresponding to a display area DA may be defined by a shielding pattern 323. The shielding pattern 323 may be disposed in a peripheral area surrounding the second area A2 corresponding to the display area DA.

Figure 7C:
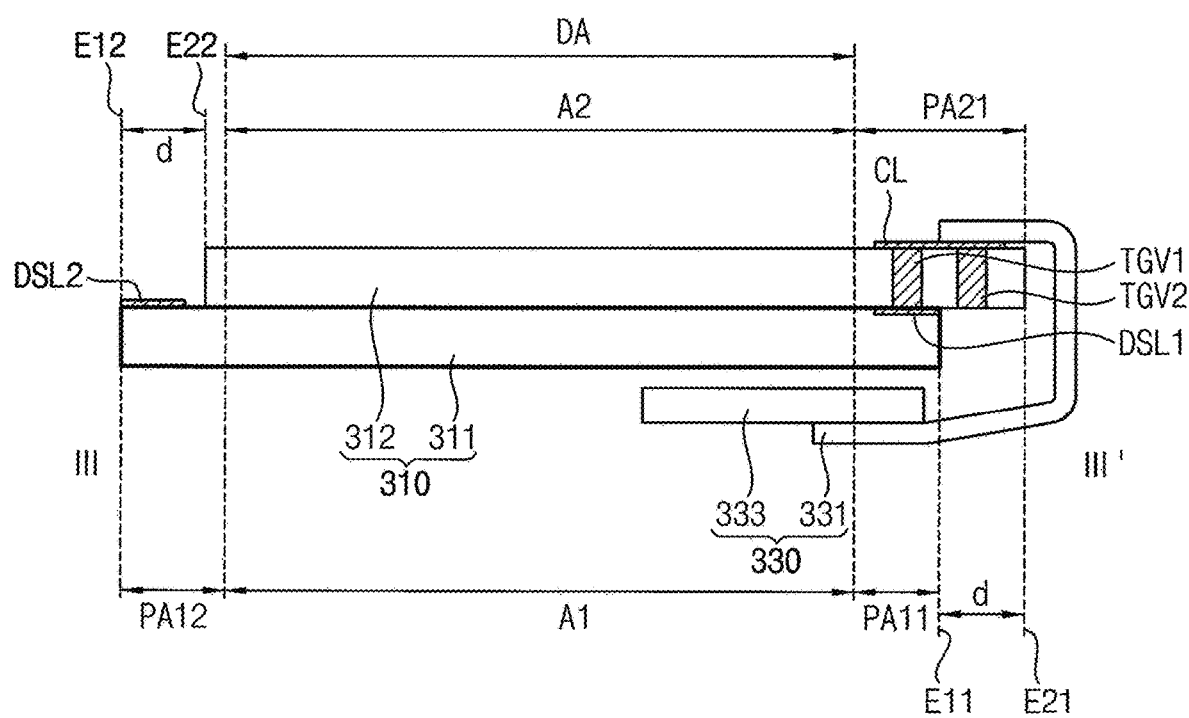
FIG. 7C is a sectional view illustrating a display panel module to which a group driving circuit unit is connected shown in FIG. 6.

Referring to FIG. 7C, a display panel module, in which a group driving circuit unit 330 is connected to a display panel 310 located at an outer side of the plurality of display panels 310, is shown.

The display panel module may include a display panel 310 and a group driving circuit unit 330. The group driving circuit unit 330 may include a flexible circuit film 331 and a printed circuit board 333.

The flexible circuit film 331 includes a first end portion and a second end portion. The first end portion is connected to a plurality of third external signal lines CL disposed or formed in a first peripheral area PA21 of the upper substrate 312. The second end portion is connected to the printed circuit board 333. The first end portion of the flexible circuit film 331 may be connected to the plurality of third external signal lines CL by a conductive adhesive member such as an anisotropic conductive film or the like. The second end portion of the flexible circuit film 331 may be connected to the printed circuit board 333 by the conductive adhesive member.

A driving circuit is disposed or mounted on the printed circuit board 333, and the printed circuit board 333 is connected to the flexible circuit film 331. The printed circuit board 333 may be disposed on a back surface of the lower substrate 311 due to a flexibility of the flexible circuit film 331. The driving circuit may generate a plurality of driving signals for driving a plurality of display panels included in the group.

In an embodiment, as described above, the group driving circuit unit 330 may be connected to the peripheral area of the display panel located at an outer side of the display panel group to reduce a width of the peripheral area of the remaining display panels included in the display panel group. Therefore, the width of shielding area such as black or gray area may be reduced in boundary area between display panels in the tiled display apparatus. In such an embodiment, an overall bezel width of the tiled display apparatus may be reduced.

Figure 8A:
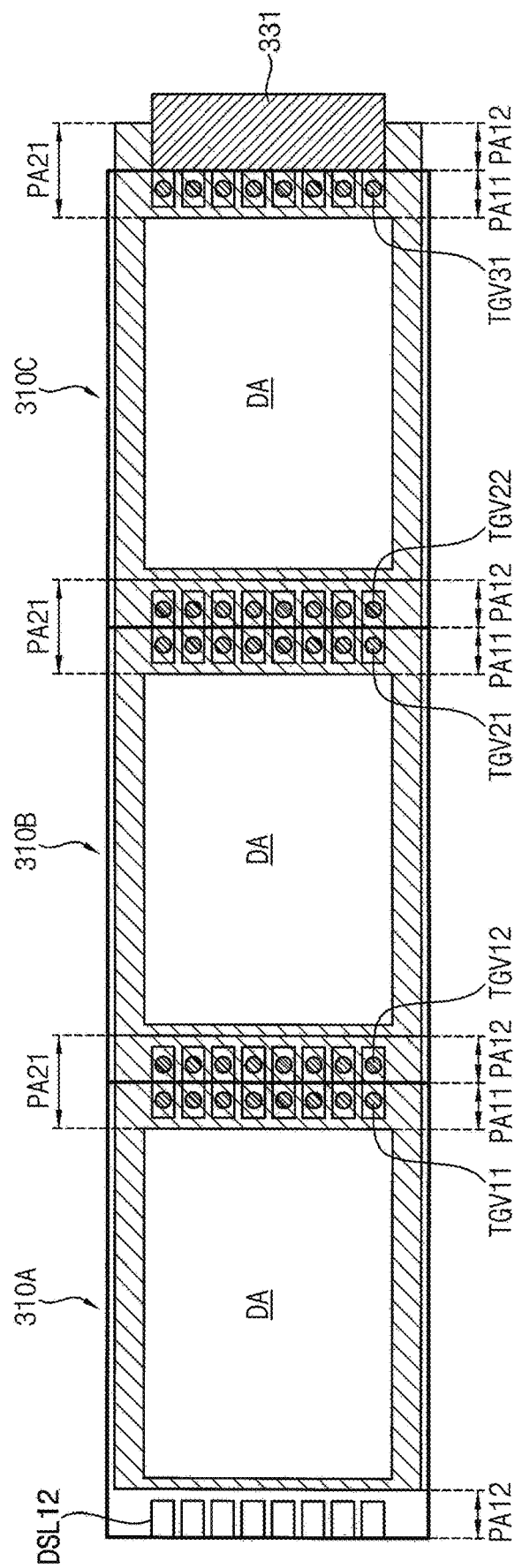
FIGS. 8A and 8B are a plain view and a sectional view illustrating a tiled display apparatus including a plurality of display panel modules and a group driving circuit unit according to an embodiment.
Figure 8B:
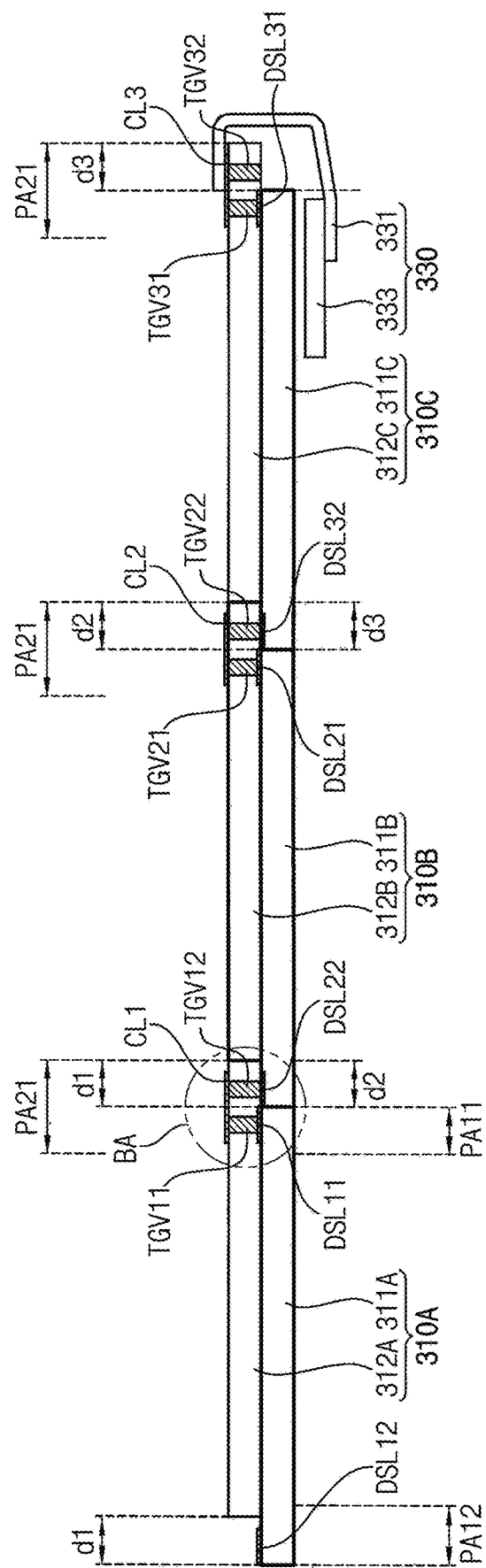

FIGS. 8A and 8B are a plain view and a sectional view illustrating a tiled display apparatus including a plurality of display panel modules and a group driving circuit unit according to an embodiment.

Referring to FIGS. 8A and 8B, an embodiment of the tiled display apparatus may include a first display panel 310A, a second display panel 310B and a third display panel 310C.

The first display panel 310A includes a first lower substrate 311A and a first upper substrate 312A. The first lower substrate 311A includes a plurality of first external signal lines DSL11 arranged in a first peripheral area PA11 and a plurality of second external signal lines DSL12 arranged in a second peripheral area PA12. The first upper substrate 312A is staggered by the first separation distance d1 in the horizontal direction with respect to the first lower substrate 311A to expose the plurality of second external signal lines DSL12 of the first lower substrate 311A. A plurality of third external signal lines CL1 is arranged in the first peripheral area PA21 of the first upper substrate 312A. The plurality of third external signal lines CL1 is connected to the plurality of first through-hole terminals TGV11 and the plurality of second through-hole terminals TGV12.

The first peripheral area PA21 of the first upper substrate 312A is protruded by the first separation distance d1 with respect to the first lower substrate 311A. The second peripheral area PA12 of the first lower substrate 311A is protruded by the first separation distance d1 with respect to the first upper substrate 312A.

The second display panel 310B includes a second lower substrate 311B and a second upper substrate 312B. The second lower substrate 311B includes a plurality of first external signal lines DSL21 arranged in a first peripheral area PA11 and a plurality of second external signal lines DSL22 arranged in a second peripheral area PA12. The second upper substrate 312B is staggered by the second separation distance d2 in the horizontal direction with respect to the second lower substrate 311B to expose the plurality of second external signal lines DSL22 of the second lower substrate 311B. A plurality of third external signal lines CL2 is arranged in the first peripheral area PA21 of the second upper substrate 312B. The plurality of third external signal lines CL2 are connected to a plurality of first through-hole terminals TGV21 and a plurality of second through-hole terminals TGV22.

The first peripheral area PA21 of the second upper substrate 312B is protruded by the second separation distance d2 with respect to the second lower substrate 311B. The second peripheral area PA12 of the second lower substrate 311B is protruded by the second separation distance d2 with respect to the second upper substrate 312B. The first separation distance d1 and the second separation distance d2 are substantially equal to each other.

The third display panel 310C includes a third lower substrate 311C and a third upper substrate 312C. The third lower substrate 311C includes a plurality of first external signal lines DSL31 arranged in a first peripheral area PA11 and a plurality of second external signal lines DSL32 arranged in a second peripheral area PA12. The third upper substrate 312C is staggered by a third separation distance d3 in the horizontal direction with respect to the third lower substrate 311C to expose the second plurality of external signal lines DSL32 of the third lower substrate 311C. A plurality of third external signal lines CL3 is arranged in a first peripheral area PA21 of the third upper substrate 312C. The plurality of third external signal lines CL3 are connected to a plurality of first through-hole terminals TGV31 and a plurality of second through-hole terminals TGV32.

The first peripheral area PA21 of the third upper substrate 312C is protruded by the third separation distance d3 with respect to the third lower substrate 311C. The second peripheral area PA12 of the third lower substrate 311C is protruded by the third separation distance d3 with respect to the third upper substrate 312C. The second separation distance d2 and the third separation distance d3 are substantially equal to each other.

In such an embodiment, where the third display panel 310C is located at an outer side of the plurality of display panels in the group, the third display panel 310C is connected to the group driving circuit unit 330.

The group driving circuit unit 330 may include a flexible circuit film 331 and a printed circuit board 333.

The flexible circuit film 331 includes a first end portion and a second end portion. The first end portion of the flexible circuit film 331 is connected to the plurality of third external signal lines CL3 disposed or formed in the first peripheral area PA21 of the third upper substrate 312C. The second end portion of the flexible circuit film 331 is connected to the printed circuit board 333. The first end portion of the flexible circuit film 331 may be connected to the plurality of third external signal lines CL3 by a conductive adhesive member such as an anisotropic conductive film or the like. The second end portion of the flexible circuit film 331 may be connected to the printed circuit board 333 by the conductive adhesive member.

The driving circuit is disposed or mounted on the printed circuit board 333 and the printed circuit board 333 is connected to the flexible circuit film 331. The printed circuit board 333 may be disposed on the upper or lower surface of the third display panel 310C due to a flexibility of the flexible circuit film 331.

The first upper substrate 312A of the first display panel 310A protruded by the first separation distance d1 overlaps the second lower substrate 311B of the second display panel 310B protruded by the second separation distance d2.

The second upper substrate 312B of the second display panel 310B protruded by the second separation distance d2 overlaps the third lower substrate 311C of the third display panel 310C protruded by the third separation distance d3.

In an embodiment, as described above, the display panel of the plurality of display panel modules having a staggered structure may be arranged in a way such that the upper substrate and the lower substrate of the display panels adjacent in the horizontal direction overlap each other.

Figure 9A:
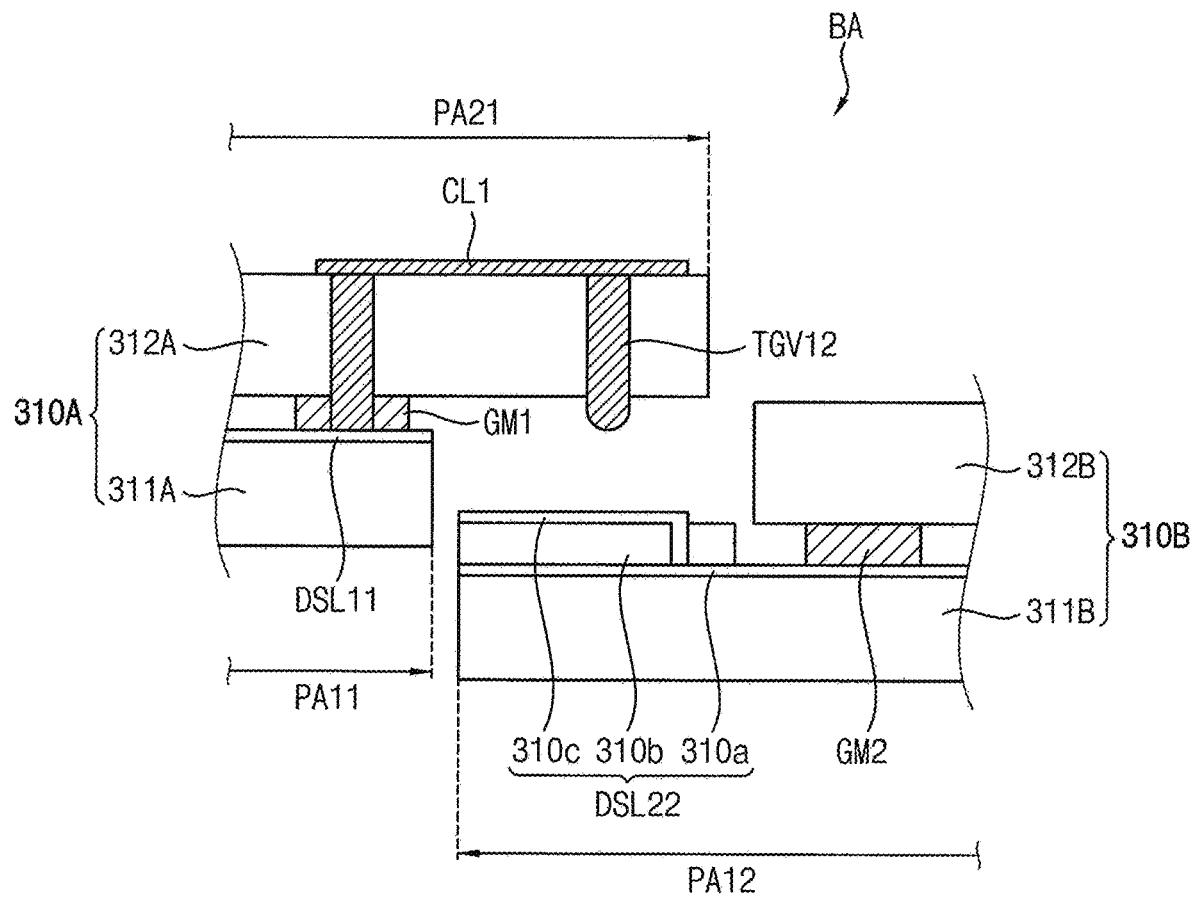
FIGS. 9A and 9B are enlarged views of an encircled boundary portion of the plurality of display panels shown in FIG. 8B.
Figure 9B:
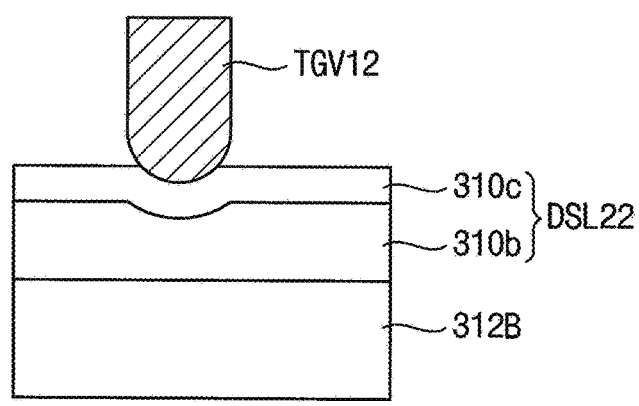

FIGS. 9A and 9B are enlarged views of an encircled boundary portion of the plurality of display panels shown in FIG. 8B.

Referring to FIGS. 9A and 9B, in a boundary area BA of the display panels, the first display panel 310A includes a first lower substrate 311A, a first upper substrate 312A and a first gap maintaining member GM1. The first gap maintaining member GM1 maintains a gap between the first lower substrate 311A and the first upper substrate 312A.

The first external signal line DSL11 is arranged in a first peripheral area PA11 of the first lower substrate 311A.

The third external signal line CL1 is arranged in the first peripheral area PA21 of the first upper substrate 312A. The third external signal line CL1 is connected to the first through-hole terminal TGV11 and the second through-hole terminal TGV12.

The first through-hole terminal TGV11 is in contact with the first external signal line DSL11 arranged in the first peripheral area PA11 of the first lower substrate 311A through the first upper substrate 312A and the first gap maintaining member GM1.

The second display panel 310B includes a second lower substrate 311B, a second upper substrate 312B and a second gap maintaining member GM2. The second gap maintaining member GM2 maintains a gap between the second lower substrate 311B and the second upper substrate 312B.

The second external signal line DSL22 is arranged in the second peripheral area PA12 of the second lower substrate 311B.

The second external signal line DSL22 may include a first line layer 310a, a buffer layer 310b and a second line layer 310c disposed or formed in second peripheral area PA12 of the second lower substrate 311B.

The first line layer 310a may extend from the display area and the peripheral area of the second lower substrate 311B.

The buffer layer 310b includes an elastic material having elasticity and is disposed in the second peripheral area PA12 on the first line layer 310a. The buffer layer 310b may include silicon (Si) or polyimide (PI).

In such an embodiment, where the second external signal line DSL22 and the second through-hole terminal TGV12 are in contact with each other, the buffer layer 310b may be deformed to correspond to the shape of the end portion of the second through-hole terminal TGV12. The contact area between the second external signal line DSL22 and the second through-hole terminal TGV12 may be increased to allow a stable electrical contact therebetween.

A thickness of the buffer layer 310b may be about 50 micrometers (μm) or greater and about 100 μm or less or in a range of about 50 μm to about 100 μm.

The second line layer 310c may be disposed on the buffer layer 310b and may be connected to the first line layer 310 through a contact hole defined or formed in the buffer layer 310b. Alternatively, the second line layer 310c may be disposed on upper and side surfaces of the buffer layer 310b patterned in a line shape and connected to the first line layer 310a through the second line layer 310c disposed on the side surface. Accordingly, the second through-hole terminal TGV12 may be electrically connected to the signal lines included in the second lower substrate 311B by contacting the second line layer 310c.

According to embodiments, in the tiled display apparatus, the plurality of through-hole terminals is disposed or formed in a peripheral area of a display panel, and the plurality of through-hole terminals is connected to a driving circuit unit. In such embodiments, the plurality of through-hole terminals is disposed or formed in a peripheral area of a display panel, and adjacent display panels are electrically connected to each other through the plurality of through-hole terminals. Thus, a plurality of display panels arranged in one direction may be driven by a single driving circuit unit.

Therefore, in an embodiment of the tiled display apparatus, the shielding area corresponding to the boundary between the display panel and the display panel may be reduced, and the overall bezel width of the tiled display apparatus may be reduced.

The invention may be applied to a display device and an electronic device having the display device. For example, the invention may be applied to a computer monitor, a laptop, a digital camera, a cellular phone, a smart phone, a smart pad, a television, a personal digital assistant ("PDA"), a portable multimedia player ("PMP"), a MP3 player, a navigation system, a game console, a video phone, etc.

The foregoing is illustrative of the invention and is not to be construed as limiting thereof. Although a few embodiments of the invention have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A display panel which comprises a display area in which a plurality of pixels is arranged and a plurality of peripheral areas surrounding the display area, the display panel comprising:

a first substrate including a first surface and a second surface, wherein the first substrate includes a portion defining the display area, and a plurality of portions defining the plurality of peripheral areas, respectively;

a second substrate disposed opposite to the first substrate, wherein the second substrate includes a portion defining the display area, and a plurality of portions defining the plurality of peripheral areas, respectively, and the first surface of the first substrate is disposed closer to the second substrate than the second surface of the first substrate is, and the plurality of pixels is disposed between the portion of the first substrate defining the display area and the portion of the second substrate defining the display area;

a first external signal line disposed on the first surface of the first substrate in a first peripheral area of the plurality of peripheral areas and connected to an external device, wherein the first surface of the first substrate is between the first external signal line and the second surface of the first substrate; and a first through-hole terminal comprising a conductive material filled in a hole defined completely through the first substrate in an area in which the first external signal line is disposed, wherein the plurality of pixels displays an image, wherein the second substrate is combined with the first substrate in a staggered structure to expose the first through-hole terminal, wherein the first external signal line is connected to a driving circuit unit, which drives the plurality of pixels, via the first through-hole terminal, the driving circuit unit being disposed on the second surface of the first substrate, wherein the driving circuit unit comprises a flexible circuit film and a printed circuit board on which a driving circuit is mounted, wherein the flexible circuit film overlaps the first through-hole terminal, and wherein overlapping portions of the flexible circuit film and the through-hole terminal are in contact with each other.

2. The display panel of claim 1, wherein
the plurality of peripheral areas comprise a sealant area in which a sealing member which combines the first and second substrates is disposed, and
the first through-hole terminal is disposed in the sealant area.

3. A display panel which comprises a display area in which a plurality of pixels is arranged and a plurality of peripheral areas surrounding the display area, the display panel comprising:
a first substrate comprising a first external signal line disposed in a first peripheral area of the plurality of peripheral areas and a second external signal line disposed in a second peripheral area of the plurality of peripheral areas, wherein the second peripheral area is disposed opposite to the first peripheral area;
a second substrate combined with the first substrate;
a first through-hole terminal comprising a conductive material filled in a hole defined through the second substrate and in contact with the first external signal line;
a second through-hole terminal spaced apart from the first through-hole terminal and comprising a conductive material filled in a hole defined through the second substrate; and
a third external signal line disposed on the second substrate and connected to the first and second through-hole terminals exposed on the second substrate.

4. A tiled display apparatus comprising:
a plurality of display panels arranged in a matrix form; and
a driving circuit unit which drives at least one of the plurality of display panels,
wherein each of the plurality of display panels comprises:
a substrate divided into a display area and a peripheral area surrounding the display area, wherein the substrate comprises a first substrate and a second substrate disposed opposite to each other and divided into the display area and the peripheral area surrounding the display area, a plurality of pixels is disposed between the display area of the first substrate and the display area of the second substrate, the first substrate includes a first surface and a second surface, and the first surface of the first substrate is disposed closer to the second substrate than the second surface of the first substrate is;
an external signal line disposed on the first surface of the first substrate in the peripheral area of the substrate and connected to an external device, wherein the first surface of the first substrate is between the external signal line and the second surface of the first substrate; and
a through-hole terminal comprising a conductive material filled in a hole defined completely through the first substrate in an area in which the external signal line is disposed,
wherein the plurality of pixels displays an image,
wherein the external signal line is connected to the driving circuit unit, which drives the plurality of pixels, via the through-hole terminal, the driving circuit unit being disposed on the second surface of the first substrate, wherein the driving circuit unit comprises a flexible circuit film and a printed circuit board on which a driving circuit is mounted,
wherein the flexible circuit film overlaps the through-hole terminal
wherein overlapping portions of the flexible circuit film and the through-hole terminal are in contact with each other.

5. The tiled display apparatus of claim 4, wherein
the flexible circuit film is connected to the through-hole terminal exposed on the outer surface of the first substrate opposite to the inner surface of the first substrate on which the external signal line is disposed; and
the printed circuit board is connected to the flexible circuit film.

6. The tiled display apparatus of claim 4, wherein
the second substrate is combined and is staggered with the first substrate to expose the through-hole terminal.

7. The tiled display apparatus of claim 6, wherein
the first substrate of a first display panel of the plurality of display panels overlaps the second substrate of a second display panel of the plurality of display panels, which is adjacent to the first peripheral area of the first display panel, and
the second substrate of the first display panel overlaps the first substrate of a third display panel of the plurality of display panels, which is adjacent to a second peripheral area of the first display panel opposite to the first peripheral area of the first display panel.

8. The tiled display apparatus of claim 4, wherein
the peripheral area comprises a sealant area in which a sealing member is disposed, and
the through-hole terminal is disposed in the sealant area.

9. The tiled display apparatus of claim 4, wherein the substrate of the each of the plurality of display panels comprises:
a first substrate through which the through-hole terminal disposed in a first peripheral area thereof; and
a second substrate combined with the first substrate,
wherein the first substrate and the second substrate are combined in a non-staggered structure.

10. The tiled display apparatus of claim 4, wherein
the driving circuit unit is connected to a display panel disposed at an outer side of a group of the plurality of display panels, which is arranged in one direction, and
the driving circuit unit provides a driving signal to the group of the plurality of display panels arranged in the one direction.

11. The tiled display apparatus of claim 10, wherein the group of the plurality of display panels arranged in the one direction comprises:
a first substrate comprising a first external signal line arranged in a first peripheral area and a second external signal line arranged in a second peripheral area facing the first peripheral area;
a second substrate combined to the first substrate and comprising a third external signal line disposed in the first peripheral area;
a first through-hole terminal disposed through the second substrate of an area where the third external signal line is disposed; and
a second through hole terminal spaced apart from the first through hole terminal and disposed through the second substrate of an area where the third external signal line is disposed.

12. The tiled display apparatus of claim 11, wherein
the flexible circuit film is connected to the third external signal line of the display panel; and
a printed circuit board is connected to the flexible circuit film.

13. The tiled display apparatus of claim 11, wherein the first substrate and the second substrate are combined in a staggered structure to expose the second external signal line disposed in the second peripheral area of the first substrate and the second through-hole terminal disposed in the first peripheral area of the second substrate.

14. The tiled display apparatus of claim 13, wherein
the third external signal line is disposed on a first surface of the second substrate, and
the first through-hole terminal is exposed to a second surface facing the first surface of the second substrate and in contact with the first external signal line.

15. The tiled display apparatus of claim 14, wherein the second through-hole terminal is exposed to the second surface of the second substrate and in contact with the second external signal line of the display panel adjacent to the display panel.

16. The tiled display apparatus of claim 14, wherein
a second substrate of a first display panel overlaps a first substrate of a second display panel adjacent to the first peripheral area of the first display panel, and
a second substrate of the first display panel overlaps a first substrate of a third display panel adjacent to the second peripheral area of the first display panel.

17. The tiled display apparatus of claim 11, wherein the second external signal line comprises:
a first line layer extending from a display area and a peripheral area of the first substrate;
a buffer layer disposed over the first line layer; and
a second line layer disposed on the buffer layer and connected to the first line layer.

18. The tiled display apparatus of claim 17, wherein the buffer layer comprises an elastic material.

19. The tiled display apparatus of claim 17, wherein the buffer layer has a thickness in a range of about 50 micrometers to about 100 micrometers.

* * * * *